(12) United States Patent
Randall et al.

(10) Patent No.: US 7,326,293 B2
(45) Date of Patent: Feb. 5, 2008

(54) PATTERNED ATOMIC LAYER EPITAXY

(75) Inventors: John N. Randall, Richardson, TX (US); Jingping Peng, Plano, TX (US); Jun-Fu Liu, Newmarket, NH (US); George D. Skidmore, Richardson, TX (US); Christof Baur, Dallas, TX (US); Richard E. Stallcup, II, Little Elm, TX (US); Robert J. Folaron, Plano, TX (US)

(73) Assignee: Zyvex Labs, LLC, Richardson, TX (US)

( * ) Notice: Subject to any disclaimer, the term of this patent is extended or adjusted under 35 U.S.C. 154(b) by 252 days.

(21) Appl. No.: 11/089,814

(22) Filed: Mar. 25, 2005

(65) Prior Publication Data

US 2005/0223968 A1    Oct. 13, 2005

Related U.S. Application Data

(60) Provisional application No. 60/556,614, filed on Mar. 26, 2004.

(51) Int. Cl.
*C30B 19/08*    (2006.01)

(52) U.S. Cl. ............... 117/55; 117/54; 117/86; 117/94; 117/95

(58) Field of Classification Search ............... 117/54, 117/55, 86, 94, 95
See application file for complete search history.

(56) References Cited

U.S. PATENT DOCUMENTS

| | | | |
|---|---|---|---|
| 3,119,266 A | 1/1964 | Atkinson | |
| 3,134,942 A | 5/1964 | Rhodes | |
| 3,535,515 A | 10/1970 | Jones et al. | |
| 3,714,423 A | 1/1973 | Lucas | |
| 4,019,073 A | 4/1977 | Vishnevsky et al. | |
| 4,463,257 A | 7/1984 | Simpkins et al. | |
| 4,587,431 A | 5/1986 | Uemura | |
| 4,601,551 A | 7/1986 | Pettingell et al. | |
| 4,607,220 A | 8/1986 | Hollman | |
| 4,672,256 A | 6/1987 | Okuno et al. | |
| 4,678,955 A | 7/1987 | Toda | |
| 4,729,646 A | 3/1988 | Clark et al. | |
| 4,736,129 A | 4/1988 | Endo et al. | |
| 4,798,989 A | 1/1989 | Miyazaki et al. | |

(Continued)

FOREIGN PATENT DOCUMENTS

DE    19524907 A1    1/1997

(Continued)

OTHER PUBLICATIONS

European Patent Application 03734223.5 Search Report dated Oct. 18, 2006.

(Continued)

*Primary Examiner*—Robert Kunemund
(74) *Attorney, Agent, or Firm*—Haynes and Boone, LLP

(57) ABSTRACT

A patterned layer is formed by removing nanoscale passivating particle from a first plurality of nanoscale structural particles or by adding nanoscale passivating particles to the first plurality of nanoscale structural particles. Each of a second plurality of nanoscale structural particles is deposited on each of corresponding ones of the first plurality of nanoscale structural particles that is not passivated by one of the plurality of nanoscale passivating particles.

26 Claims, 4 Drawing Sheets

U.S. PATENT DOCUMENTS

| | | | |
|---|---|---|---|
| 4,874,979 A | 10/1989 | Rapp | |
| 4,880,975 A | 11/1989 | Nishioka et al. | |
| 4,893,914 A | 1/1990 | Hancock et al. | |
| 4,919,001 A | 4/1990 | Ogiwara et al. | |
| 4,956,923 A | 9/1990 | Pettingell et al. | |
| 5,036,205 A | 7/1991 | Clement et al. | |
| 5,055,680 A | 10/1991 | Kesmodel et al. | |
| 5,068,535 A | 11/1991 | Rabalais | |
| 5,081,353 A | 1/1992 | Yamada et al. | |
| 5,089,740 A | 2/1992 | Ono | |
| 5,117,110 A | 5/1992 | Yasutake et al. | |
| 5,124,645 A | 6/1992 | Rhoden et al. | |
| 5,225,683 A | 7/1993 | Suzuki et al. | |
| 5,237,238 A | 8/1993 | Berghaus et al. | |
| 5,412,503 A | 5/1995 | Nederlof | |
| 5,455,420 A | 10/1995 | Ho et al. | |
| 5,493,236 A | 2/1996 | Ishii et al. | |
| 5,510,615 A | 4/1996 | Ho et al. | |
| 5,568,004 A | 10/1996 | Kleindiek | |
| 5,589,723 A | 12/1996 | Yoshida et al. | |
| 5,635,836 A | 6/1997 | Kirtley et al. | |
| 5,756,997 A | 5/1998 | Kley | |
| 5,922,179 A | 7/1999 | Mitro et al. | |
| 5,939,816 A | 8/1999 | Culp | |
| 5,980,950 A | 11/1999 | Porter | |
| 5,989,779 A | 11/1999 | Hatakeyama et al. | |
| 5,994,820 A | 11/1999 | Kleindiek | |
| 6,000,280 A | 12/1999 | Miller et al. | |
| 6,002,136 A | 12/1999 | Naeem | |
| 6,105,589 A | 8/2000 | Vane | |
| 6,111,336 A | 8/2000 | Yoshida et al. | |
| 6,127,681 A | 10/2000 | Sato et al. | |
| 6,127,682 A | 10/2000 | Nakamoto | |
| 6,188,161 B1 | 2/2001 | Yoshida et al. | |
| 6,191,598 B1 | 2/2001 | Hollman | |
| 6,194,833 B1 | 2/2001 | DeTemple et al. | |
| 6,198,299 B1 | 3/2001 | Hollman | |
| 6,210,988 B1 | 4/2001 | Howe et al. | |
| 6,268,958 B1 | 7/2001 | Furuhashi | |
| 6,279,389 B1 | 8/2001 | Adderton et al. | |
| 6,329,826 B1 | 12/2001 | Shinada et al. | |
| 6,337,479 B1 | 1/2002 | Kley | |
| 6,344,750 B1 | 2/2002 | Lo et al. | |
| 6,346,710 B1 | 2/2002 | Ue | |
| 6,353,219 B1 | 3/2002 | Kley | |
| 6,403,968 B1 | 6/2002 | Hazaki et al. | |
| 6,420,722 B2 | 7/2002 | Moore et al. | |
| 6,422,077 B1 | 7/2002 | Krauss et al. | |
| 6,448,622 B1 | 9/2002 | Franke et al. | |
| 6,452,307 B1 | 9/2002 | Olin et al. | |
| 6,452,315 B1 | 9/2002 | Vane | |
| 6,501,289 B1 | 12/2002 | Takekoshi | |
| 6,538,254 B1 | 3/2003 | Tomimatsu et al. | |
| 6,539,519 B1 | 3/2003 | Meeker | |
| 6,583,413 B1 | 6/2003 | Shinada et al. | |
| 6,603,239 B1 | 8/2003 | Michely et al. | |
| 6,610,257 B2 | 8/2003 | Vane | |
| 6,621,282 B2 | 9/2003 | Hollman | |
| 6,627,889 B2 | 9/2003 | Ochiai et al. | |
| 6,690,101 B2 | 2/2004 | Magnussen et al. | |
| 6,781,125 B2 | 8/2004 | Tokuda et al. | |
| 6,852,167 B2 * | 2/2005 | Ahn | 118/715 |
| 6,861,648 B2 | 3/2005 | Kley | |
| 6,865,509 B1 | 3/2005 | Hsiung et al. | |
| 6,891,170 B1 | 5/2005 | Yu et al. | |
| 6,927,400 B2 | 8/2005 | Rasmussen | |
| 6,960,765 B2 | 11/2005 | Tomimatsu et al. | |
| 6,967,335 B1 | 11/2005 | Dyer et al. | |
| 7,043,848 B2 | 5/2006 | Hollman et al. | |
| 7,045,780 B2 | 5/2006 | Kley | |
| 7,074,310 B2 | 7/2006 | Smalley et al. | |
| 7,114,406 B2 | 10/2006 | Wright et al. | |
| 7,132,039 B2 | 11/2006 | Anazawa | |
| 2001/0044156 A1 | 11/2001 | Kelly et al. | |
| 2002/0027563 A1 | 3/2002 | Van Doan et al. | |
| 2002/0053522 A1 | 5/2002 | Cumings et al. | |
| 2002/0064341 A1 | 5/2002 | Fauver et al. | |
| 2002/0121614 A1 | 9/2002 | Moore | |
| 2002/0125427 A1 | 9/2002 | Chand et al. | |
| 2002/0138353 A1 | 9/2002 | Schreiber et al. | |
| 2002/0166976 A1 | 11/2002 | Sugaya et al. | |
| 2003/0042921 A1 | 3/2003 | Hollman | |
| 2003/0089852 A1 | 5/2003 | Ochiai et al. | |
| 2003/0089860 A1 | 5/2003 | Asjes | |
| 2003/0137539 A1 | 7/2003 | Dees | |
| 2003/0187867 A1 | 10/2003 | Smartt | |
| 2003/0212725 A1 | 11/2003 | Ovshinsky et al. | |
| 2004/0132254 A1 * | 7/2004 | Herr et al. | 438/291 |
| 2004/0245466 A1 | 12/2004 | Robinson et al. | |
| 2005/0029467 A1 | 2/2005 | Yu et al. | |
| 2005/0178980 A1 | 8/2005 | Skidmore et al. | |
| 2005/0184028 A1 | 8/2005 | Baur et al. | |
| 2005/0184236 A1 | 8/2005 | Baur et al. | |
| 2005/0193576 A1 | 9/2005 | Hollman et al. | |
| 2006/0076503 A1 | 4/2006 | Tsao | |
| 2006/0180264 A1 | 8/2006 | Kisch et al. | |
| 2006/0192116 A1 | 8/2006 | Baur et al. | |
| 2007/0022804 A1 | 2/2007 | Kley | |

FOREIGN PATENT DOCUMENTS

| | | |
|---|---|---|
| EP | 0927880 | 7/1999 |
| EP | 1516220 A0 | 3/2005 |
| EP | 1520200 A0 | 4/2005 |
| EP | 1566647 A1 | 8/2005 |
| EP | 1574282 A2 | 9/2005 |
| EP | 1671346 A0 | 6/2006 |
| JP | 2072535 | 3/1990 |
| JP | 5018706 | 1/1993 |
| JP | 11135051 A | 5/1999 |
| JP | 2001198896 A | 7/2001 |
| JP | 2002033366 A | 1/2002 |
| WO | WO96/13724 | 5/1996 |
| WO | WO 96/20495 | 7/1996 |
| WO | WO 00/10191 | 8/1999 |
| WO | WO01/09965 | 2/2001 |
| WO | WO02/16089 | 2/2002 |
| WO | 03/107066 A1 | 12/2003 |
| WO | 05/031789 A2 | 4/2005 |
| WO | 2005/031789 A3 | 5/2005 |

OTHER PUBLICATIONS

International Preliminary Report on Patentability PCT/US04/031482 dated Jan. 30, 2006.
PCT Written Opinion PCT/US03/016695 dated Mar. 23, 2004.
PCT Written Opinion PCT/US03/016750 dated Mar. 23, 2004.
Vane, Ronald in "Plasma Cleaning inside SEMS", XEI Scientific, Jul. 2002.
"Electrical Characterization of Transistors in an SRMA Array for the 90nm Process Node", Multi Probe, Inc., Santa Barbara, California, Application Note: MPI 011603, 2002.
"IDS 10000cs", Schlumberger Semiconductor Solutions, San Jose, California, Aug. 2001.
"Investment Approaches: Lux NanoSphere: Measurement", Nanotechnology, The Nanotech Report 2001, pp. 122-136.
"KZ100 Nanomanipulator System", Zyvex Corporation, Richardson, Texas, Document: KZ00-ZZDS-001c, 2004.
"NanoEffector Tools", Zyvex Corporation, http://www.zyvex.com/Products/Grippers_Features.html, no date.
"Processing Material in Electron Microscopes: Nanomanipulation With Several D.O.F." http://www.nanomotor.de/aa_processing.htm, no date.
"SEM-Manipulators," http://www.nanomotor.de/pdf/Compare_e_lo.PDF, no date.

"SRAM Probing with Multiscan AFP", MultiProbe, Inc., Santa Barbara, California, Multiprobe Movie, 2004.

"Zyvex A100 Assembly System", Zyvex Corporation, Richardson, Texas, Document: A100-ZZDS-001c, 2004.

"Zyvex F100 Nanomanipulator System", Zyvex Corporation, Richardson, Texas, Document: F100-ZZDS-001c, 2004.

"Zyvex Mdriver 1000 MEMS Driving Station", Zyvex Corporation, Richardson, Texas, Document: ZMDR-ZZDS-001a, 2004.

"Zyvex NanoSharp Probes", Zyvex Corporation, Richardson, Texas, Document: ZPRB-ZZDS-001c, 2004.

"Zyvex Nanosolve Additives for Epoxies", Zyvex Corporation, Richardson, Texas, Document: EPOX-ZZDS-001a, 2004.

"Zyvex Nanosolve Additives for Polyurethane", Zyvex Corporation, Richardson, Texas, Document: ZNAP-ZZDA-001c, 2004.

"Zyvex Nanosolve Additives", Zyvex Corporation, Richardson, Texas, Document: ZZPN-ZZDS-001c, 2004.

"Zyvex S100 Nanomanipulation System", Zyvex Corporation, Richardson, Texas, Document: S100-ZZDS-001c, 2004.

Akazawa, "Bistable Si Growth Conditions on Ge(100) in Synchrotron-Radiation-Excited Atomic Layer Epitaxy from $SiH_2Cl_2$,", J. Appl. Phys. 81(7), Apr. 1, 1997, pp. 3320-3322.

Akazawa, "Characterization of self-limiting SiH2Cl2 chemisorption and photon-stimulated desorption as elementary steps for Si atomic-layer epitaxy", NTT LSI Lab., Kanagawa, Japan, Physical Review B: Condensed Matter (1996), 54(15), pp. 10917-10926.

Beck et al., "Ultrahigh Vacuum Instrument That Combines Variable-Temperature Scanning Tunneling Microscopy with Fourier Transform Infrared Reflection-Absorption Spectroscopy for Studies of Chemical Reactions at Surfaces," Rev. Sci. Instrum. 73(3), Mar. 2002, pp. 1267-1272.

Bergander et al., "A Testing Mechanism and Testing Procedure for Materials in Inertial Drives", IEEE MHS, pp. 213-218, Nagoya, Oct. 20-22, 2002 (best paper award).

Bergander et al., "Development of Miniature Manipulators for Applications in Biology and Nanotechnologies", proceedings of Workshop "Microrobotics for Biomanipulation", pp. 11-35, IEEE IROS 2003, Oct. 27-31, 2003, Las Vegas, USA.

Bergander et al., "Integrated Sensors for PZT Actuators Based on Thick-Film Resistors", IEEE MHS, pp. 181-186, Nagoya, Oct. 20-22, 2002.

Bergander et al., "Micropositioners for Microscopy Applications based on the Stick-Slip Effect", MHS 2000, Nagoya, pp. 213-216, Oct. 22-25, 2000.

Bergander et al., "Monolithic Piezoelectric Push-pull Actuators for Inertial Drives", IEEE MHS, pp. 309-316, Nagoya, Oct. 19-22, 2003.

Bergander et al., "Performance Improvements for Stick-Slip Positioners", IEEE MHS, pp. 59-66, Nagoya, Oct. 19-22, 2003.

Bergander et al., "Micropositioners for Microscopy Applications and Microbiology Based on Piezoelectric Actuators", Journal of Micromechatronics, vol. 2, No. 1, pp. 65-76, 2003.

Bergander, *"Control, Wear Testing & Integration Of Stick-Slip Micropositioning"*, these No. 2843, EPFL, Lausanne, Switzerland, 2003.

Binning et al., "Single-tube three-dimensional scanner for scanning tunneling microscopy", Rev. Sci. Instrum. 57(8), Aug. 1986, pp. 1688-1689.

Blackford et al., "A vertical/horizontal two-dimensional piezoelectric driven intertial slider micropositioner for cryogenic applications", Rev. Sci. Instrum. 63(4), Apr. 1992, pp. 2206-2209.

Bleuler et al., "Applications of microrobotics and microhandling" in RIKEN Review No. 36 (Jun. 2001): Focused on Science and Technology in Micro/Nano Scale, pp. 26-28.

Breguet et al., "New Designs For Long Range, High Resolution, Multi-Degrees-Of-Freedom Piezoelectric Actuators", ACTUATOR'98, Bremen, Germany, pp. 198-201, Jun. 17-19, 1998.

Breguet et al., "Stick and Slip Actuators: design, control, performances and applications", International Symposium on Micromechatronics and Human Science, Nagoya, Japan, pp. 89-95, Nov. 25-28, 1998.

Breguet, "Stick and Slip Micro-Robots", Institut de Systemes Robotiques (ISR), Jan. 14, 1999.

Co et al., "Iso-splatting: A Point-Based Alternative to Isosurface Visualization", Computer Graphics and Applications, 2003. Proceedings 11th Pacific Conference on Oct. 8-10, 2003, Piscataway, NJ, IEEE, Oct. 8, 2003, pp. 325-334.

Codourey et al., "High Precision Robots for Automated handing of Micro Objects", Seminar on Handing and Assembly of Microparts, Vienna, Nov. 1994.

Colclough, "A fast high-voltage amplifier for driving piezoelectric positioners", Rev. Sci. Instrum. 71(11), Mar. 2000, pp. 4323-4324.

Danuser et al., "Manipulation of Microscopic Objects with Nanometer Precision: Potentials and Limitations in Nano-Robot Design", no date.

Dr. Volker Klocke Nanotechnik, Technical Data from Klocke Nanotechnik Websites, Aachen, Germany, 1998, 127 pages and CD ROM with movie.

Driesen et al., "Energy Consumption of Piezoelectric Actuators for Inertial Drives", IEEE MHS, pp. 51-58, Nagoya, Oct. 19-22, 2003.

Eigler et al., "Positioning Single Atoms with a Scanning Tunnelling Microscope", Nature, vol. 344, Apr. 5, 1990, pp. 524-526.

Erickson, "Gate Fault Isolation and Parametric Characterization through the use of Atomic Force Probing". Multiprobe, Inc. Santa Barbara, California, no date.

European Search Report from EP05251070.8, dated Jun. 27, 2005.

Fatikow et al., "A Flexible Microbiol-Based Microassembly Station", Emerging Technologies and Factory Automation, 1999. Proceeding ETFA '99. 1999 7th IEEE International Conference, Barcelona, Spain Oct. 18-21, 1999, Piscataway, NJ USA, pp. 397-406.

Frohn et al., "Coarse Tip Distance Adjustment and Positioner for a Scanning Tunnelling Microscope", Rev. Sci. Instrum. 60(6), Jun. 1989, pp. 1200-1201.

FuturePundit, "Nanopore Technology: Sequence your DNA in Two hours!", Sep. 4, 2002, http://www.futurepundit.com/archives/000017.htm.

Gupta, "Attaching a Nanotube to a Zyvex S100 Nanomanipulator End Effector", Zyvex Corporation, Richardson, Texas, Document: S1EE-ZZAN-001a, 2004.

Gupta, et al., "Measuring Electrical Breakdown of a Dielectric-Filled Trench Used for Electrical Isolation of Semiconductor Devices", Zyvex Corporation, Richardson, Texas, Document: MEBD-ZZAN-001a, 2004.

Hartman, "Mechanical Measurement of Individual Carbon Nanotubes Using MEMS and the S100 Nanomanipulator", Zyves Corporation, Richardson, Texas, Document: MMIC-ZZAN-001b, 2004.

Hasunuma et al., "Gas-Phase-Reaction-Controlled Atomic-Layer Epitaxy of Silicon", J. Vac. Sci. Technol. A16 (1998) 679.

Hersam et al., "Silicon-Based Molecular Nanotechnology", Nanotechnology 11, (2000), pp. 70-76.

Hinze, "Memo Functions, Polytypically!", Institut fur Informatik III, University Bonn, Bonn Germany, Jul. 2000.

Hochberg et al., "Four Point Probe I-V Electrical Measurements Using the Zyvex Test System Employing a Keithley 4200", Zyvex Corporation, Richardson, Texas, Document: KZ00-ZZAN-001a, 2004.

IBM Research Press Solutions, "IBM Scientists Build World's Smallest Operating Computing Circuits", San Jose, CA, Oct. 24, 2002.

Imai et al., "Atomic layer epitaxy of silicon by gas confinement method", Department Physical Electronics, Tokyo Institute Technology, Tokyo, Japan, Transactions of the Materials Research Society of Japan (1994), 19A (Superconductors, Surfaces and Superlattices), pp. 145-148.

International Preliminary Examination Report PCT/US03/16695, dated Sep. 3, 2004.

International Preliminary Examination Report PCT/US03/16750, dated Sep. 3, 2004.

International Search Report and Written Opinion from PCT Application No. PCT/US2004/035625, Mar. 2005.

International Search Report and Written Opinion from PCT/US2004/043833, May 25, 2005.

International Search Report PCT/US03/16695, dated Sep. 25, 2003.

International Search Report PCT/US03/16750, dated Sep. 25, 2003.

International Search Report/Written Opinion PCT/US2004/031482, dated Mar. 18, 2005.

Ishida et al., "Growth temperature window and self-limiting process in sub-atomic-layer Epitaxy", Faculty Technology, Tokyo University Agriculture and Technology, Koganeri, Japan. Japanese Journal of Applied Physics, Part 1: (1996), 35(7), pp. 4011-4015.

Kiocke Nanotechnik, "Manipulators: Universal Tools with 1 Nanometer Resolution," http://www.nanomotor.de/p_nanomanipulator.htm.

Langen et al., "Stick-slip actuators for micromachining of glass", International Conference on Micromechatronics for Information and Precision Equipment, Tokyo, Japan, pp. 261-264, Jul. 20-23, 1997.

Lyding et al., "Variable-temperature scanning tunneling microscope", Rev. Sci. Instrum. 59 (9), Sep. 1998, pp. 1897-1902.

Matsuyama et al., "Hetero atomic-layer epitaxy of Ge on Si(100)", Japanese Journal of Applied Physics, Part 1, vol. 39, No. 5A, May 2000, pp. 2536-2540.

Meller et al., "Voltage-Driven DNA Translocations through a Nanopore", Physical Review Letters, vol. 86, No. 15, Apr. 9, 2001, pp. 3435-3438.

Moller et al., "Tunneling Tips Imaged by Scanning Tunneling Microscopy", J. Vac. Sci. Technol. A 8 (1), Jan./Feb. 1990, pp. 434-437.

Mugele et al., "New Design of a variable-temperature ultrahigh vacuum scanning tunneling microscope", Rev. Sci. Instrum. 69(4), Apr. 1998, pp. 1765-1769.

Ott et al., "A1203 thin film growth on Si (100) using binary reaction sequence chemistry", Thin Solid Films 292 (1997) 135-144.

Parker et al., "Exploiting Self-Similarity in Geometry for Voxel Based Solid Modeling", Proc Symp Solid Model Appl; Proceedings of the Symposium on Solid Modeling and Applications 2003, Jun. 2003, pp. 157-166.

Pérez et al. "*Modelling, characterisation and implementation of a monolithic piezo actuator (MPA) of 2 and 3 degrees of freedom (DOF)*", Actuator 2002, Bremen, Germany, Jun. 10-12, 2002.

Pérez et al., "Monolithic piezo-actuators: modeling, validation in the laboratory and optimisation of working conditions", ACTUATOR 2000, pp. 49-52, Bremen, Germany, Jun. 19-21, 2000.

Physik Instrumente, Theory and Applications of Piezo Actuators and PZT NanoPositioning Systems, www.physikinstrumente.com/tutorial, 2001.

PI, "Basic Introduction to Nano-Positioning with Piezoelectric Technology", http/www.pi.ws, pp. 4/9-4/14, no date.

Piezo Brochure, "Ultra Sonic Transducers & Crystals", no date.

Pohl, "Dynamic Piezoelectric Translation Devices", Rev. Sci. Instrum., 58(1), Jan. 1987, pp. 54-57.

Popinet, "Gerris: a Tree-Based Adaptive Solver for the Incompressible Euler Equations in Complex Geometries", Journal of Computational Physics Academic Press USA, vol. 190, No. 2, Sep. 2003.

Renner et al., "A vertical piezoelectric inertial slider", Rev. Sci. Instrum. 61 (3), Mar. 1990, pp. 965-967.

Ritala et al., "Atomic Layer Epitaxy—a valuable tool for nanotechnology?", Nanotechnology V10 1999 pp. 19-24.

Rusinkiewicz et al., "Qspalt: A Multiresolution Point Rendering System for Large Meshes", Computer Graphics Proceedings, Annual Conference Series, 2000, pp. 343-352.

Satoh et al., "Atomic-layer epitaxy of silicon on (100) surface", Japanese Journal of Applied Physics, Part 1: Regular Papers and Short Notes and Review Papers v 39 n Oct. 10, 2000, pp. 5732-5736.

Shim et al., "Piezo-driven Metrological Multiaxis Nanopositioner", Rev. Sci. Instrum., 72(1): Nov. 2001, pp. 4183-4187.

Sugahara et al., "Modeling of silicon atomic-layer epitaxy", Department of Physical Electronics, Tokyo Institute of Technology, Applied Surface Science (1996), 107 (Proceedings of the Third International Symposium on Atomically Controlled Surfaces and Interfaces, 1995). pp. 161-171.

Tu et al., "The Etree Library: A System for Manipulating Large Octrees on Disk", School of Computer Science, Pittsburgh, PA Jul. 2003.

Tuck, et al., "Powering MEMS Devices using the S100 Nanomanipulator System", Zyvex Corporation, Richardson, Texas, Document: S1PM-ZZAN-001a, 2004.

Udeshi et al., "Memulator: A Fast and Accurate Geometric Modeling, Visualization and Mesh Generation for 3D MEMS Design and Simulation," Nanotech 2003, vol. 2, Technical Proceedings of the 2003 Nanotechnology Conference and TradeShow.

Udeshi, "Tetrahedral Mesh Generation from Segmented Voxel Data", 12th International Meshing Roundtable, Sep. 14-17, 2003.

Widoer et al., "Scanning Tunneling Microscope Tip as a Positionable Contact: Probing a Josephson-Junction Array at Subkelvin Temperatures", J. Vac. Sci. Technol. B 16(5), Sep./Oct. 1998, pp. 2837-2840.

Yakimov, "Vertical Ramp-Actuated Inertial Micropositioner with a Rolling-Balls Guide", Rev. Sci. Instrum. 68 (1), Jan. 1997, pp. 136-139.

Yu et al., "Three-Dimensional Manipulation of Carbon Nanotubes Under a Scanning Electron Microscope", Nanotechnology 10 (1999), pp. 244-252.

Zesch et al., "Inertial Drives for Micro-and Nanorobots: Two Novel Mechanims" Swiss Federal Institute of Technology, no date.

Zesch, "Multi-Degree-of-Freedom Micropositioning Using Stepping Principles," Dissertation submitted to the Swiss Federal Institute of Technology, Zurich, 1997.

* cited by examiner

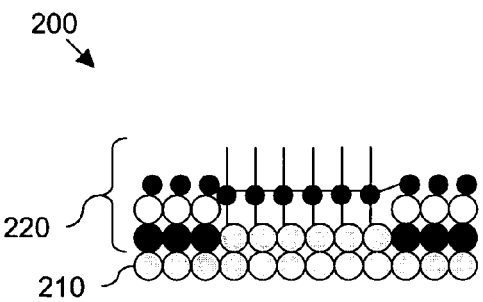
Fig. 6A
Fig. 6B
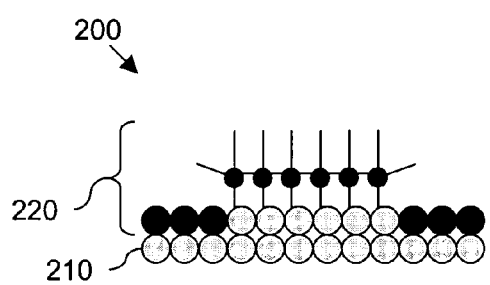
Fig. 6C
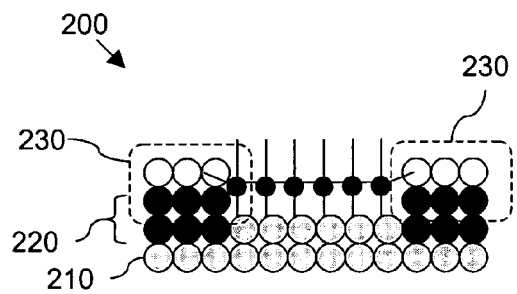
Fig. 6D
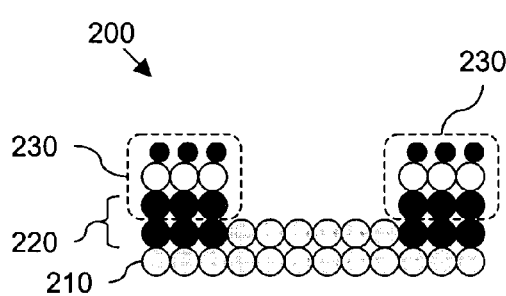
Fig. 6E
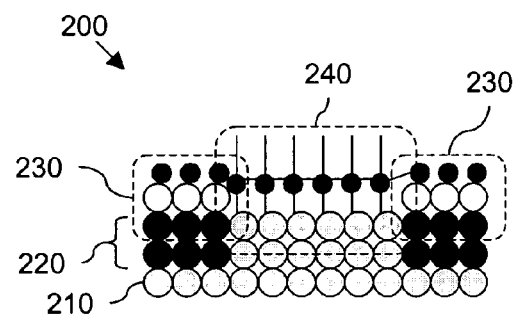
Fig. 6F ptinstants
PATTERNED ATOMIC LAYER EPITAXY This application claims the benefit of U.S. Provisional Application No. 60/556,614, entitled "Patterned Atomic Layer Epitaxy," filed Mar. 26, 2004, the entirety of which is hereby incorporated herein.

BACKGROUND

Atomic Layer Epitaxy (ALE) and Atomic Layer Deposition (ALD) have demonstrated the ability to provide layer-by-layer control in the deposition of atoms and/or molecules for many material systems using a variety of techniques. In each of these cases, the deposition process is cyclical, where a repeatable portion (less than, equal to, or somewhat greater than) of a monolayer is deposited with each full cycle. There are both gas phase and liquid phase ALE or ALD techniques for a wide range of materials. ALE or ALD processes have been developed for elemental semiconductors, compound semiconductors, metals, metal oxides, and insulators. There are ALE processes that involve the deposition of a self-limiting monolayer per cycle. For example, with gas phase gallium-arsenide (GaAs) ALE, a single monolayer of gallium (Ga) is deposited on a GaAs surface from trimethylgallium (TMG), where methyl groups passivate the gallium surface and limit the deposition to a monolayer. The TMG is pumped out and arsine is used to deposit a self-limiting layer of arsenide (As). The cycle is repeated to produce several layers of GaAs. It is also possible to substitute trimethylaluminium (TMA) instead of TMG. In this way, layered epitaxial structures, i.e., structures comprised of multiple layers, each layer in one monolayer, thus achieving atomic precision.

Various attempts have also been made for providing lateral patterning at the atomic level. One example involved using a scanning tunneling microscope (STM) to push xenon atoms across a nickel surface. Another example involved an approach for creating patterns in hydrogen atoms adsorbed on a silicon surface by getting them to desorb from the surface with electrical current from an STM that pumps energy into the silicon-hydrogen bond. The ability to selectively depassivate surfaces by removing an adsorbed monolayer of hydrogen is significant because there are ALE approaches which employ an adsorbed hydrogen layer as the self-limiting process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6A is a sectional view of at least a portion of one embodiment of a nanostructure in an intermediate stage of manufacture according to aspects of the present disclosure.

FIG. 6B is a legend corresponding to FIG. 6A.

FIG. 6C is a sectional view of the nanostructure shown in FIG. 6A in a subsequent stage of manufacture according to aspects of the present disclosure.

FIG. 6D is a sectional view of the nanostructure shown in FIG. 6C in a subsequent stage of manufacture according to aspects of the present disclosure.

FIG. 6E is a sectional view of the nanostructure shown in FIG. 6D in a subsequent stage of manufacture according to aspects of the present disclosure.

FIG. 6F is a sectional view of the nanostructure shown in FIG. 6E in a subsequent stage of manufacture according to aspects of the present disclosure.

DETAILED DESCRIPTION

Figure 1:
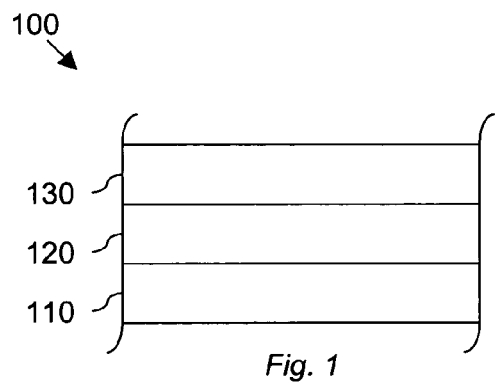
FIG. 1 is a sectional view of at least a portion of one embodiment of a nanostructure in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure also includes references to "nanoscale particles" and various types of nanoscale particles. It is to be understood that, in the context of the present disclosure, a nanoscale particle is a single atom, a single molecule and/or another single particle having dimensions on the order of the dimensions of a single atom or a single molecule. Thus, a "nanoscale structural particle" may be a structural atom, a structural molecule, or another discrete, nanoscale particle of structure having atomic-or molecular-scale dimensions.

Referring to FIG. 1, illustrated is a sectional view of at least a portion of one embodiment of a nanostructure 100 in an intermediate stage of manufacture according to aspects of the present disclosure. Manufacturing according to aspects of this and other embodiments within the scope of the present disclosure includes performing patterned layer epitaxy, including patterned ALE and ALD, which may be carried out in a vacuum environment.

The nanostructure 100 includes a substrate 110 having a layer 120 formed thereon. The substrate 110 may be or include a bulk silicon (Si) substrate or a silicon-on-insulator (SOI) substrate, among others. The layer 120 may be or include a germanium (Ge) layer which may be deposited on, or grown from, the substrate 110. The layer 120 may also include more than one layer, including more than one Ge layer.

The nanostructure 100 also includes a passivation layer 130. In one embodiment, the passivation layer 130 substantially comprises a chlorine (Cl) layer. However, in other embodiments, the passivation layer 130 may have other compositions, and may include more than one layer. The nanostructure 100 may also include one or more layers other than those shown in FIG. 1.

Figure 2:
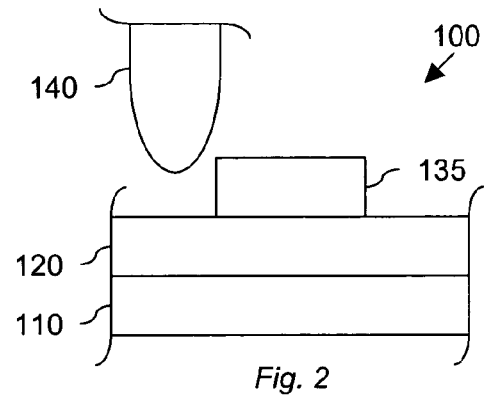
FIG. 2 is a sectional view of the nanostructure shown in FIG. 1 in a subsequent stage of manufacture according to aspects of the present disclosure.

Referring to FIG. 2, illustrated is a sectional view of the nanostructure 100 shown in FIG. 1 in a subsequent stage of manufacture, in which a pattern 135 has been formed. In the illustrated embodiment, the pattern 135 is formed by employing a scanning tunneling microscope (STM), wherein the tip 140 of the STM probe depassivates selected atoms, molecules and/or other nanoscale particles in the layer 120 by removing atoms, molecules and/or other nanoscale particles from the passivation layer 130. Consequently, a patterned passivation layer 135 may be formed. In other embodiments, a combination of photon and/or electron bombardment and STM induced field may be employed for depassivation.

Physical means could also be employed to create a patterned passivation layer. For example, a probe or tip operating on a single passivation atom, molecule and/or other nanoscale particle, or a stamp operating in parallel on several atoms, molecules and/or other nanoscale particles, may also be employed to remove the groups of atoms, molecules and/or other nanoscale particles from the passivation layer 130. For example, contacting the tip or stamp to the passivation atoms, molecules and/or other nanoscale particles being removed may create a bond that is stronger than that between the passivation atoms, molecules and/or other nanoscale particles and corresponding atoms, molecules and/or other nanoscale particles of the layer 120. Consequently, when the tip or stamp is removed, one or more passivation atoms, molecules and/or other nanoscale particles, or groups of passivation atoms, molecules and/or other nanoscale particles, may be removed from the layer 120 in a selective manner based on the configured pattern of the stamp. In a related embodiment within the scope of the present disclosure, a patterned passivation layer may be formed by transferring individual or groups of passivating atoms, molecules and/or other nanoscale particles from a probe, tip or stamp to the layer 120 (thus, adding material onto layer 120 as opposed to removing material from layer 120). For example, the passivating atoms, molecules and/or other nanoscale particles being added onto layer 120 may have a greater affinity for the surface of the layer 120 than the probe, tip or stamp. Thus, whether forming the patterned passivation layer by material addition or removal, the pattern of the patterned passivation layer may be atomically and/or molecularly precise, or otherwise precise at a nanoscale.

Figure 3:
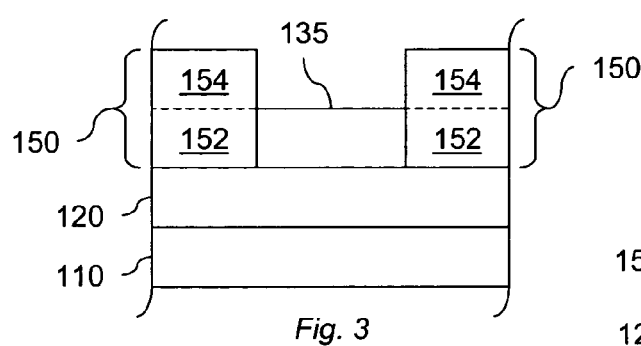
FIG. 3 is a sectional view of the nanostructure shown in FIG. 1 in a subsequent stage of manufacture according to aspects of the present disclosure.

Referring to FIG. 3, illustrated is a sectional view of the nanostructure 100 shown in FIG. 2 in a subsequent stage of manufacture, in which a passivated monolayer 150 is formed on the exposed portions of the layer 120. In the illustrated embodiment, the passivated monolayer 150 comprises silicon 152 passivated by chlorine 154, although other embodiments may employ other compositions. The passivated monolayer 150 may be grown on the exposed portions of the layer 120, possibly at a temperature of about 575° C. with a dichlorosilane (DCS) process, and subsequently pumping out any residual gases. An exemplary DCS process is described below.

Figure 4:
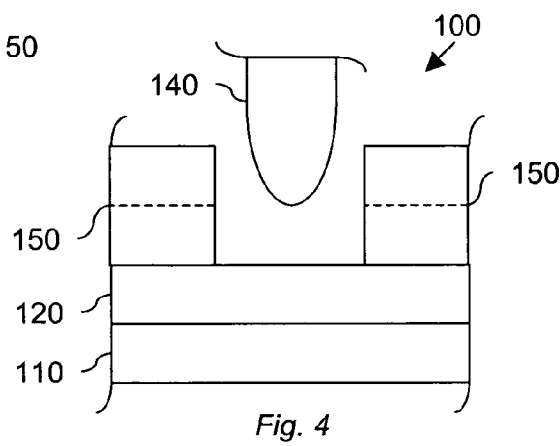
FIG. 4 is a sectional view of the nanostructure shown in FIG. 1 in a subsequent stage of manufacture according to aspects of the present disclosure.

Referring to FIG. 4, illustrated is a sectional view of the nanostructure 100 shown in FIG. 3 in a subsequent stage of manufacture, in which all or a portion of the remaining passivated layer 120 is depassivated by removing all or a portion of the patterned passivation layer 135. Such depassivation may employ one or more processes substantially similar to the depassivation described above with respect to FIG. 2, possibly including the use of the STM probe tip 140, a combination of photon and/or electron bombardment and STM induced field, physical removal with a tip or stamp, or combinations thereof. In one embodiment, the layer 120 may be depassivated at a temperature of about 440° C. and may employ atomic hydrogen. Residual gases may then be pumped out. In some embodiments, depassivating the layer 120 using atomic hydrogen converts the chlorine 154 passivating the silicon 152 to HCl, yet the silicon remains passivated with the HCl.

Figure 5:
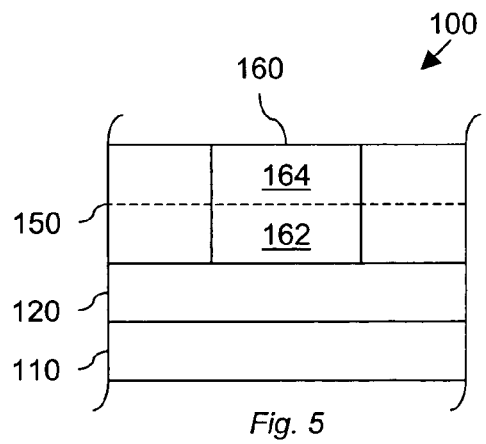
FIG. 5 is a sectional view of the nanostructure shown in FIG. 1 in a subsequent stage of manufacture according to aspects of the present disclosure.

Referring to FIG. 5, illustrated is a sectional view of the nanostructure 100 shown in FIG. 4 in a subsequent stage of manufacture, in which a passivated monolayer 160 is formed on the exposed portions of the layer 120. In the context of the present disclosure, a monolayer may be an atomic or molecular layer, having a thickness about equal to a dimension of the atoms or molecules forming the layer, or otherwise having a nanoscale thickness.

In the illustrated embodiment, the passivated monolayer 160 comprises germanium 162 passivated by a methyl group 164, although other embodiments may employ other compositions. The passivated monolayer 160 may be grown on the exposed portions of the layer 120, possibly at a temperature of about 500° C. with a dimethylgermane (DMG) process, and subsequently pumping out any residual gases.

Referring to FIG. 6A, illustrated is a schematic view of at least a portion of one embodiment of a nanostructure 200 in an intermediate stage of manufacture according to aspects of the present disclosure. FIG. 6B depicts a legend representing compositions of various parts of the nanostructure 200 according to one embodiment. However, embodiments within the scope of the present disclosure are not limited to the compositions depicted in the legend of FIG. 6B.

Aspects of the nanostructure 200 may be substantially similar to the nanostructure 100 shown in FIGS. 1-5 and/or otherwise described above. For example, the nanostructure 200 may be substantially similar to the nanostructure 100 shown in FIG. 5. The nanostructure 200 may undergo cyclic processing, as described below, to build silicon and germanium layers in the pattern established at the manufacturing stage shown in FIG. 6A, where the pattern may be established by aspects of the process shown in FIGS. 1-5 and described above.

The nanostructure 200 includes a first layer 210 which may substantially comprise germanium and may be substantially similar to the layer 120 described above. A second layer 220 includes an initial germanium pattern substantially surrounded by silicon. The germanium pattern is passivated with methyl groups and the silicon is passivated by HCl.

Referring to FIG. 6C, illustrated is a schematic view of the nanostructure 200 shown in FIG. 6A in a subsequent stage of manufacture in which the HCl passivating the silicon of the layer 220 is desorbed from the silicon by raising the temperature to about 575° C. Residual gases may subsequently be pumped out. Desorbing the HCl from the silicon may thus expose the silicon portion of the layer 220, yet the patterned germanium may remain passivated with the methyl groups.

Referring to FIG. 6D, illustrated is a schematic view of the nanostructure 200 shown in FIG. 6C in a subsequent stage of manufacture in which a monolayer 230 is formed over the depassivated silicon of layer 220. The monolayer 230 may comprise Cl-passivated silicon grown over the depassivated silicon with the DCS process described above, possibly at a temperature of about 575° C. Residual gases may subsequently be pumped out. At this stage, the germanium of layer 220 is protected from the growth process by the methyl group passivation.

Referring to FIG. 6E, illustrated is a schematic view of the nanostructure 200 shown in FIG. 6D in a subsequent stage of manufacture in which the germanium of layer 220 is depassivated by removing the methyl groups. The methyl groups may be removed by dropping the temperature of the process environment to about 450° C. and exposing the surface to atomic hydrogen. Residual gases may then be pumped out. Depassivation of the patterned germanium of layer 220 using atomic hydrogen may convert the Cl which passivates the silicon portion of layer 220 into HCl. Nonetheless, the silicon portion of layer 220 remains passivated by the HCl.

Referring to FIG. 6F, illustrated is a schematic view of the nanostructure 200 shown in FIG. 6E in a subsequent stage of manufacture in which a monolayer 240 is formed over the depassivated, patterned germanium of layer 220. The monolayer 240 may comprise methyl-group-passivated germanium grown over the unpassivated germanium portion of layer 220 using DMG at a temperature of about 450° C. The HCl passivation protects the silicon portion of layer 220 during this growth process. Residual gases may then be pumped out.

The cyclic process illustrated by FIGS. 6A-6F may be sequentially repeated to form the desired number of atomic, molecular, or otherwise nanoscale-precision layers (e.g., monolayers). In one embodiment, such sequential formation may be repeated for a first number of layers, each replicating a first pattern, and subsequently repeated for a second number of layers, each replicating a second pattern which may be somewhat or substantially different relative to the first pattern. Alternatively, or additionally, the earlier formed layers may have a first composition(s), and the subsequently formed layers may have a second composition(s) which may be substantially different relative to the first composition(s).

After completing the cyclic process illustrated by FIGS. 6A-6F a number of times, thereby forming a three-dimensional structure with atomic, molecular or otherwise nanoscale precision, the structure (e.g., the silicon structure of embodiments illustrated herein) can be released from the nanostructure 200, possibly by selectively etching the germanium with an $NH_4OH:H_2O_2$ wet etch, which etches germanium aggressively but has an essentially zero etch rate for silicon. Consequently, a nanoscale-precision silicon structure can be formed and released from an underlying substrate.

The processes employed during the manufacturing stages shown in FIGS. 6A-6F, as well as other processes within the scope of the present disclosure, may be at least partially automated. That is, the processes and steps depicted in FIGS. 6A-6F and others can be amenable to automation and semi-automation, such as by well known registration and pattern recognition technology. Additional aspects of the at least partial automation of some embodiments within the scope of the present application are provided in commonly-assigned U.S. patent application Ser. No. 11/064,127, the entirety of which is hereby incorporated by reference herein. However, other aspects of automation and semi-automation are also within the scope of the present disclosure.

Figure 7:
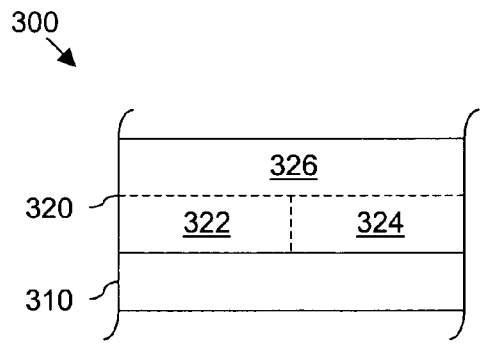
FIG. 7 is a sectional view of at least a portion of one embodiment of a nanostructure in an intermediate stage of manufacture according to aspects of the present disclosure.

Referring to FIG. 7, illustrated is a schematic view of at least a portion of one embodiment of a nanostructure 300 in an intermediate stage of manufacture according to aspects of the present disclosure. Aspects of the nanostructure 300 may be substantially similar to the nanostructure 100 shown in FIGS. 1-5, the nanostructure 200 shown in FIGS. 6A-6F, and/or otherwise described herein. The nanostructure 300 may undergo cyclic processing, as described below, to build silicon and germanium layers in the pattern established at the manufacturing stage shown in FIG. 7. At the manufacturing stage shown in FIG. 7, the nanostructure 300 includes a substrate 310 and a layer 320.

The substrate 310 may be substantially similar to the substrate 110 shown and described in reference to FIG. 1. In one embodiment, the substrate 310 presents an atomically flat silicon surface, possibly having a <100> crystallographic orientation.

In the example embodiment illustrated in FIG. 7, a portion 322 of the layer 320 substantially comprises germanium atoms and another portion 324 substantially comprises silicon atoms. The atoms of each of the germanium portion 322 and the silicon portion 324 are passivated by chlorine atoms 326. Of course, as with embodiments described above, the scope of the present disclosure is not limited to embodiments substantially comprising germanium and silicon as structural elements, or to embodiments substantially employing chlorine (or HCl) as passivation elements, or to embodiments in which the layer 320 and other layers are limited to atomic-scale monolayers, such that other embodiments within the scope of the present disclosure may employ alternative or additional materials, molecular-scale monolayers, and/or nanoscale monolayers.

Figure 8:
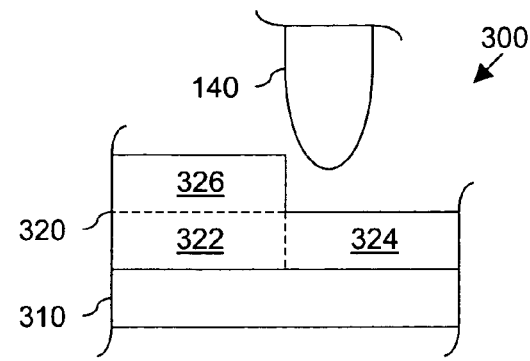
FIG. 8 is a sectional view of the nanostructure shown in FIG. 7 in a subsequent stage of manufacture according to aspects of the present disclosure.

Referring to FIG. 8, illustrated is a schematic view of the nanostructure 300 shown in FIG. 7 in a subsequent stage of manufacture in which an STM probe tip 140 is employed to depassivate the silicon. Consequently, the passivating chlorine atoms 326 of layer 320 are removed from the silicon portion of the layer 320.

Figure 9:
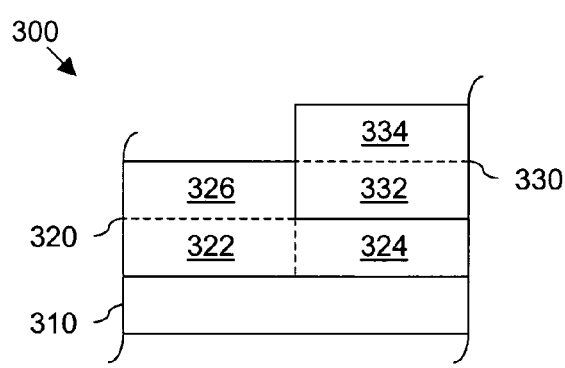
FIG. 9 is a sectional view of the nanostructure shown in FIG. 8 in a subsequent stage of manufacture according to aspects of the present disclosure.

Referring to FIG. 9, illustrated is a schematic view of the nanostructure 300 shown in FIG. 8 in a subsequent stage of manufacture in which a monolayer 330 of silicon 332 with chlorine passivation 334 is formed over the unpassivated silicon portion of layer 320. The monolayer 330 may be grown with DCS at 575° C.

Figure 10:
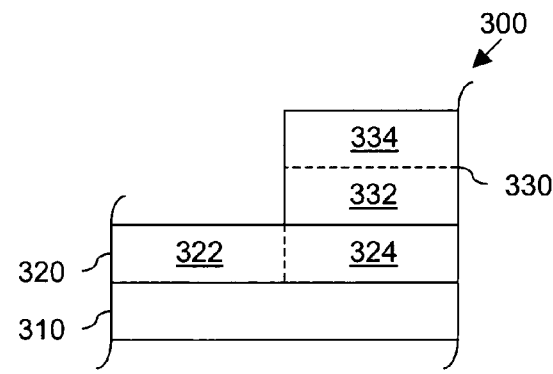
FIG. 10 is a sectional view of the nanostructure shown in FIG. 9 in a subsequent stage of manufacture according to aspects of the present disclosure.

Referring to FIG. 10, illustrated is a schematic view of the nanostructure 300 shown in FIG. 9 in a subsequent stage of manufacture in which the germanium portion of layer 320 is depassivated. Consequently, the passivating chlorine atoms 326 over layer 320 are removed from the germanium portion 322 of layer 320. The depassivation may be achieved by dropping the temperature to 500° C. or lower and exposing the surface to atomic hydrogen. In some embodiments, the depassivation of the germanium portion 322 of layer 320 converts the chlorine atoms passivating the silicon 332 of layer 330 to HCl. Nonetheless, the silicon 332 of layer 330 remains passivated.

Figure 11:
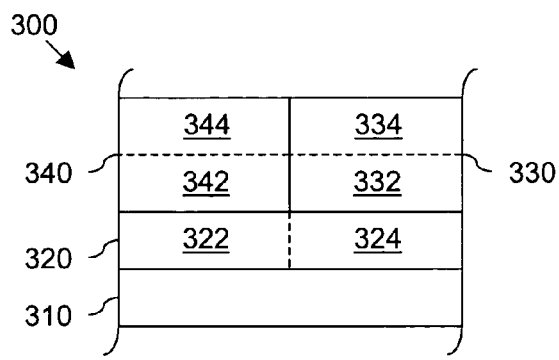
FIG. 11 is a sectional view of the nanostructure shown in FIG. 10 in a subsequent stage of manufacture according to aspects of the present disclosure.

Referring to FIG. 11, illustrated is a schematic view of the nanostructure 300 shown in FIG. 10 in a subsequent stage of manufacture in which a monolayer 340 of germanium 342 with methyl group passivation 344 is formed over the unpassivated germanium portion of layer 320. The monolayer 340 may be grown at 500° C. using DMG.

Figure 12:
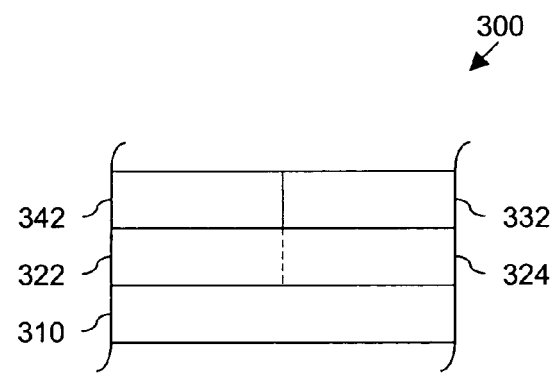
FIG. 12 is a sectional view of the nanostructure shown in FIG. 11 in a subsequent stage of manufacture according to aspects of the present disclosure.

Referring to FIG. 12, illustrated is a schematic view of the nanostructure 300 shown in FIG. 11 in a subsequent stage of manufacture in which the methyl-passivated-germanium 340 is depassivated by removing the methyl groups 344 and the chlorine-passivated-silicon 330 is depassivated by removing the chlorine 334. The respective depassivations can occur simultaneously or sequentially, such as by raising the temperature above 500° C., possibly employing atomic hydrogen.

Figure 13:
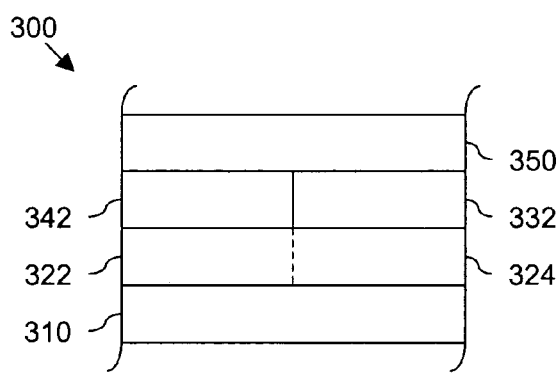
FIG. 13 is a sectional view of the nanostructure shown in FIG. 12 in a subsequent stage of manufacture according to aspects of the present disclosure.

Referring to FIG. 13, illustrated is a schematic view of the nanostructure 300 shown in FIG. 12 in a subsequent stage of manufacture in which the depassivated germanium 342 and silicon 332 are passivated by dosing with molecular chlorine 350. The cyclic process of FIGS. 7-13 can be sequentially repeated to grow additional germanium and silicon layers with atomic precision. Moreover, the cyclic process, and repetitions thereof, can be implemented as one or more automated or semi-automated processes.

After the desired number of atomic layers are grown, the silicon structures (324, 332, etc.) can be released by selectively etching the germanium. For example, an $NH_4OH$:$H_2O_2$ wet etch may be employed to selectively etch the germanium, although alternative or additional etching compositions and/or selective etch processes are also within the scope of the present disclosure.

In the above description of exemplary embodiments according to aspects of the present disclosure, a dichlorosilane (DCS) process may be used during certain stages. Generally, dichlorosilane ($SiCl_2H_2$ DCS) and hydrogen ($H_2$) may be used as precursor gases, and the process may be performed at a constant temperature of about 575° C. In one embodiment, the process is performed in a load-locked, turbomolecular, pumped system, with a base pressure of about $3 \times 10^{-9}$ Torr, or possibly a lower pressure. The load lock chamber may have a base pressure of $5 \times 10^{-7}$ Torr. Mass flow controllers (MFC) and a conductance valve may be used to control the pressure and residence time of the gases in the chamber. A tungsten filament may be heated to about 2000° C., at least during part of the deposition cycle, to crack $H_2$ into atomic hydrogen. A sample heater may be used to keep the sample at the operating temperature of about 575° C.

One reaction that leads DCS to sub-monolayer per cycle deposition is:

where (g) refers to the gas phase, (a) indicates surface adsorbed atoms or molecules and 4_indicates four active surface states on the Si surface.

DCS may break down in the gas phase according to the following, although in some embodiments SiCl is not the dominant gas species:

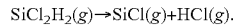

A potential description of a reaction at 575° C. Where the H will desorb and result in a Cl passivated monolayer of Si is:

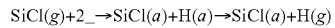

The passivation layer of Cl may be removed by thermally cracking $H_2$ to make atomic H, which reacts with the Cl to make HCl, which thermally desorb from the Si surface.

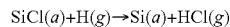

With the Si sample at a constant 575° C., the Si ALE cycle may proceed as follows:
1) DCS introduced to the chamber at a pressure of about 17 mTorr for a duration of about 20 seconds;
2) DCS pumped from the chamber for about 20 seconds;
3) $H_2$ introduced to the chamber at a pressure of about 0.5 mTorr, where the tungsten filament is held at about 2000° C. For about 15 seconds; and
4) $H_2$ evacuated from chamber for about 30 seconds.

According to aspects of another embodiment of the processes described above, silicon and germanium atomic layer epitaxy (ALE) processes can be integrated to achieve atomic, molecular, or otherwise nanoscale precision patterning which may be employed as an improved process for producing monochloro silane (MS, SiCl). Current methods for producing monochloro silane require adjusting pressure, residence time, and sample temperature to produce MS "in the vicinity of the heated sample" with a poorly understood gas phase process.

However, according to aspects of the present disclosure, the improved process for producing MS provides for more deliberate processes in the gas phase, such as thermal or microwave dissociation, which could be used to significantly improve the ratio of MS to DCS in the gas phase, result in fewer defects, and possibly a wider window for deposition a single monolayer per cycle.

According to another example of an improved process for producing MS, the MS is separated via ionization, mass separation and neutralization. Consequently, MS may be the exclusive, or at least the dominant, species arriving at the surface.

According to some embodiments within the scope of the present disclosure, silicon chloride or germanium chloride radicals may be delivered directly to the surface, which may improve monolayer deposition over a large temperature range, possibly with few or no vacancies created by the need to deposit extra hydrogen on the surface. In one such example, SiH and GeH radicals could provide ALE processes that require hydrogen depassivation only.

In the processes described above and otherwise within the scope of the present disclosure, one example of a tool for implementing atomically precise manufacturing (APM) methods includes an STM or other scanning probe instrument. Moveable tethers may also be employed to handle releasable parts. Other tools which may alternatively or additionally be employed include a nanomanipulator, including those having multiple tips, and/or a MEMS-based nanopositioning system. Such tools can further comprise software and systems to operate the APM methods described herein as an automated or semi-automated process.

An extensively parallel patterned ALE tool may also be employed as part of a nanomanufacturing system. One example of such a parallel patterned ALE tool may include a microautomation effort for developing an assembly system architecture.

One or more embodiments of the methods and/or tools described herein may provide or enable one of more of the following, where A and B components represent different atomic, molecular and/or nanoscale feedstock or building materials, such as germanium and silicon atoms:

Full monolayer deposition per cycle;

A passivating chemistry that can be locally depassivated with a scanning probe;

Atomic, molecular and/or nanoscale precision depassivation;

Reasonable conductivity in the substrate on which the passivation layer is formed;

A substrate comprising a robust mechanical material;

A substrate comprising a flexible material system where A and B components can be grown;

Etch selectivity between such A and B components;

Atomic, molecular and/or nanoscale precision in all 3 dimensions;

Multiple patterning for complex structures;

Heteroepitaxy in multiple dimensions (A and B materials);

The use of A and B materials for scaffolding and as a sacrificial layer; and

Templated, selective ALE growth of AB monolayers.

In addition, the ability to fill each monolayer with A and B nanoscale particles as described herein can provide or enable, in some embodiments, one or more of the following:

Patterning can be done on a substantially flat surface, or at worst, one with single layer nanoscale particle step edges, which is particularly suitable for STM patterning;

Developing an etch for B nanoscale particles that has a high selectivity over A nanoscale particles, which may enable use of B nanoscale particle volumes as a sacrificial layer, possibly permitting A nanoscale particle structures to be releasable;

Providing A and B components where there is some etch selectivity between A and B components may enable the creation of complex three-dimensional structures that are releasable from the substrate by depositing complete monolayers of part A nanoscale particles and part B nanoscale particles where the patterning defined which areas were A nanoscale particles and which were B nanoscale particles;

With the B nanoscale particles being used as scaffolding, relatively complex structures of A nanoscale particles may be constructed; and The stability of the structure during growth may be better than if A nanoscale particles were not constrained laterally, and concerns about growth on exposed sidewalls may be eliminated.

Although the examples of methods and tools described herein may sometimes refer to specific constituents, alternatives are available within the scope of the present disclosure. For example, in addition to deposition processes described above, the materials selected for A and B may additionally or alternatively be deposited via diamond chemical-vapor-deposition (CVD), thus providing a diamond-based ALE approach.

Other considerations regarding the myriad embodiments within the scope of the present disclosure regard the materials selected for A and B. That is, the materials selected for A and B may both comprise metals, in contrast to germanium and silicon in the exemplary embodiments described above. Where A and B both comprise metals, the methods disclosed herein may be adjusted to compensate for potential stability issues that may be encountered as metal nanoscale particles reside on a metal substrate. Also, the materials for A and B (metallic or otherwise) may be selected to have similar or substantially equal lattice constants. In other embodiments, the materials for A and B may be selected to have lattice constants which differ by less than about 5%, 10%, 20% or some other predetermined variance, possibly depending on the degree of adhesion between the materials A and B and/or the underlying substrate.

The materials selected for A and B may also or alternatively comprise metal oxides, such as $Al_2O_3$. When A and B comprise metal oxides, depassivation techniques employed in methods discloses herein may be adjusted, such as where the passivation chemistry may be either methyl or hydroxyl groups, where trimethylaluminum (TMA) may be used to react with the OH groups and deposit methyl passivated Al, and $H_2O$ may be used to replace the methyl groups and deposit OH groups.

Embodiments according to aspects of the present disclosure may also substitute carbon, a carbon alloy and/or a carbon compound for the silicon and/or germanium in one or more layers and/or the underlying substrate of the embodiments described above. In embodiments employing selective etch processing, however, selecting material substitutions for silicon and/or germanium should take into account the selectivity (i.e., etch resistivity) of the substitute materials. Such a consideration may be less critical where alternatives to selective etching may be employed.

Other materials may also be substituted for the above-described use of hydrogen. For example, many embodiments may replace or augment the hydrogen with a methyl group, an ethyl group, and/or other univalent or monovalent radicals, among other compositions. Similarly, many embodiments may replace or augment the above-described use of chlorine with another halogen, among other compositions.

Methods of atomically, molecularly and otherwise nanoscale precise manufacturing described herein may also be implemented in a liquid phase process. According to one example of a liquid phase process, the materials selected for A and B may comprise insulating materials, such as sapphire.

In addition, although a scanning tunneling microscope is used as the scanning probe microscope in several of the methods and tools described herein, other suitable scanning probe microscopes include but are not limited to atomic force microscopes (AFMs). In an example where an AFM is used, the patterning technique may be described as AFM based nanolithography.

The methods and tools described herein can be used to grow releasable silicon nanostructures with atomic, molecular or otherwise nanoscale precision. One example of a nanostructure that could be so made is a nanopore, which is a 2 nm aperture in a thin (~2 nm) membrane. A single nanopore can be an enormously valuable component of a tool that sequences DNA. The pore could separate two volumes of electrolyte solution and an ionic current through the nanopore may be measured. A strand of DNA can the be pumped through the nanopore. As the DNA goes through the pore, the ionic current can be modified in a way that depends on the base that is in the pore. In this way, very long strands of DNA may be read at a rate exceeding one base per millisecond. A single nanopore may sequence the entire human genome in a month. With 500 nanopores, the entire gene sequence of an individual may be read in 2 hours. With atomically precise nanopores made according to the methods described herein, even a single serial prototype tool could produce very significant value. Other exemplary nanostructures that could be prepared according to the present methods include atomically precise tips, nano machine parts, and structural parts (bricks, plates, beams, etc.).

Thus, among other aspects, the present disclosure introduces a method comprising, at least in one embodiment, patterning a layer by removing each of a plurality of passivating molecules which each passivate a corresponding one of a first plurality of structural molecules forming the layer. Each of a second plurality of structural molecules is then deposited on each of corresponding ones of the first plurality of structural molecules from which one of the plurality of passivating molecules was removed.

Another embodiment of a method according to aspects of the present disclosure includes patterning a layer by removing each of a first plurality of passivating molecules which each passivate a corresponding one of a first plurality of structural molecules forming the layer. Each of a second plurality of structural molecules is then formed on each of corresponding ones of the first plurality of structural molecules from which one of the first plurality of passivating molecules was removed, wherein each of the second plurality of structural molecules is passivated. Each of a second plurality of passivating molecules is then removed, the second plurality of passivating molecules each passivating a corresponding one of a third plurality of structural molecules forming the layer. Each of a fourth plurality of structural molecules is then formed on each of corresponding ones of the third plurality of structural molecules from which one of the plurality of second plurality of passivating molecules was removed, wherein each of the fourth plurality of structural molecules is passivated.

Another embodiment of a method according to aspects of the present disclosure includes patterning a layer by placing each of a plurality of passivating molecules on a corresponding one of a first plurality of structural molecules forming the layer, wherein the layer comprises the first plurality of structural molecules and a second plurality of structural molecules. Each of a third plurality of structural molecules is then deposited on each of corresponding ones of the second plurality of structural molecules. Aspects of two or more of these embodiments may also be combined as additional embodiments within the scope of the present disclosure.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    patterning a layer by removing each of a plurality of nanoscale passivating particles which each passivate a corresponding one of a first plurality of nanoscale structural particles forming the layer; and
    depositing each of a second plurality of nanoscale structural particles on each of corresponding ones of the first plurality of nanoscale structural particles from which one of the plurality of nanoscale passivating particles was removed;
    wherein at least one of the patterning and the depositing is at least partially automated.

2. The method of claim 1 wherein each of the plurality of nanoscale passivating particles is one of a single passivating molecule and a single passivating atom, and wherein each of the first and second pluralities of nanoscale structural particles is one of a single structural molecule and a single structural atom.

3. The method of claim 1 wherein each of the plurality of nanoscale passivating particles is a single passivating atom, and wherein each of the first and second pluralities of nanoscale structural particles is a single structural atom.

4. The method of claim 1 further comprising repeating the patterning and the depositing to individually form each of a plurality of structural layers each having a thickness about equal to a thickness of one of the first plurality of nanoscale structural particles.

5. The method of claim 1 wherein depositing the second plurality of nanoscale structural particles forms a monolayer having a thickness about equal to one of the first plurality of nanoscale structural particles.

6. The method of claim 1 wherein the plurality of nanoscale passivating particles substantially comprises at least one of hydrogen atoms, chlorine atoms, HCl molecules, and methyl group molecules.

7. The method of claim 1 wherein the patterning includes at least one of:
    individually removing each of ones of the plurality of nanoscale passivating particles with a scanning probe instrument, in a substantially serial manner; and
    substantially simultaneously removing each of ones of the plurality of nanoscale passivating particles with a parallel array of scanning probes, in a substantially parallel manner.

8. The method of claim 1 wherein the patterning includes at least one of:
    individually removing each of ones of the plurality of nanoscale passivating particles with one of a probe, a tip and a stamp, in a substantially serial manner; and
    substantially simultaneously removing each of ones of the plurality of nanoscale passivating particles with one of a probe, a tip and a stamp, in a substantially parallel manner.

9. The method of claim 1 wherein the layer is located on a substrate comprising at least one of silicon and germanium, and the depositing is by atomic layer epitaxy of silicon employing hydrogen for passivation.

10. The method of claim 1 wherein the depositing is by liquid phase atomic layer epitaxy.

11. The method of claim 1 wherein each of the first and second pluralities of nanoscale structural particles comprises a plurality of first nanoscale particles having a first composition and a plurality of second nanoscale particles having a second composition that is different relative to the first composition.

12. The method of claim 11 wherein the first plurality of nanoscale particles comprises a plurality of silicon atoms and the second plurality of nanoscale particles comprises a plurality of germanium atoms.

13. The method of claim 1 wherein the depositing includes growing the second plurality of nanoscale structural particles.

14. The method of claim 1 further comprising repeating the patterning and the depositing to individually form a plurality of structural layers, wherein the repeated patterning includes patterning a first pattern to which first ones of the plurality of deposited structural layers correspond and subsequently patterning a second pattern to which second ones of the plurality of deposited structural layers correspond.

15. A method, comprising:
    (a) patterning a layer by removing each of a first plurality of nanoscale passivating particles which each passivate a corresponding one of a first plurality of nanoscale structural particles forming the layer;

(b) forming each of a second plurality of nanoscale structural particles on each of corresponding ones of the first plurality of nanoscale structural particles from which one of the first plurality of nanoscale passivating particles was removed, wherein each of the second plurality of nanoscale structural particles is passivated;

(c) removing each of a second plurality of nanoscale passivating particles which each passivate a corresponding one of a third plurality of nanoscale structural particles forming the layer; and (d) forming each of a fourth plurality of nanoscale structural particles on each of corresponding ones of the third plurality of nanoscale structural particles from which one of the plurality of second plurality of nanoscale passivating particles was removed, wherein each of the fourth plurality of nanoscale structural particles is passivated;

wherein at least one of steps (a)-(d) is at least partially automated.

16. The method of claim 15 wherein each of the first plurality of nanoscale passivating particles is substantially different in composition relative to each of the second plurality of nanoscale passivating particles, permitting their selective removal.

17. The method of claim 15 wherein a first process employed to remove the first plurality of nanoscale passivating particles is different relative to a second process employed to remove the second plurality of nanoscale passivating particles.

18. The method of claim 15 wherein each of the first and second pluralities of nanoscale structural particles have a first composition and each of the third and fourth pluralities of nanoscale structural particles have a second composition.

19. The method of claim 15 wherein a first one of the first and second compositions is silicon and a second one of the first and second compositions is germanium.

20. The method of claim 19 wherein the silicon is deposited from precursor gas dichlorosilane and the germanium is deposited from precursor gas dimethylgermane.

21. The method of claim 20 wherein passivating chemistry for silicon is one of chlorine and HCl and passivating chemistry for germanium is methyl groups, the depassivation of the methyl groups from the Ge employs atomic hydrogen, and the depassivation of HCl from Si is accomplished by raising the temperature of the sample to desorb the HCl from the Si while leaving the methyl groups passivating the Ge.

22. The method of claim 15 wherein the layer includes nanoscale particles of at least three different compositions, wherein the nanoscale particles includes at least one of molecules and atoms, and wherein a thickness of the layer is equal to a thickness of one of the at least one of molecules and atoms.

23. A method, comprising:

patterning a layer by placing each of a plurality of nanoscale passivating particles on a corresponding one of a first plurality of nanoscale structural particles forming the layer, wherein the layer comprises the first plurality of nanoscale structural particles and a second plurality of nanoscale structural particles and has a thickness about equal to a dimension of one of the first and second pluralities of nanoscale structural particles; and depositing each of a third plurality of nanoscale particles molecules on each of corresponding ones of the second plurality of nanoscale structural particles;

wherein at least one of the patterning and the depositing is at least partially automated.

24. The method of claim 23 wherein each of the first plurality of nanoscale structural particles has a first composition and each of the second plurality of nanoscale structural particles has a second composition that is substantially different relative to the first composition.

25. The method of claim 23 wherein placing includes substantially simultaneously placing ones of the plurality of nanoscale passivating particles in a procedurally parallel manner.

26. The method of claim 25 wherein placing includes substantially simultaneously placing ones of the plurality of nanoscale passivating particles with one of a probe, a tip and a stamp.

* * * * *